United States Patent
Colinet et al.

(10) Patent No.: US 12,262,499 B2
(45) Date of Patent: Mar. 25, 2025

(54) ASSEMBLY COMPRISING AN ELECTRICAL SUPPLY MODULE AND A PROTECTION DEVICE FOR SAID MODULE, AIR CONDITIONING UNIT EQUIPPED WITH SUCH AN ASSEMBLY

(71) Applicant: Valeo Systemes Thermiques, Le Mesnil Saint Denis (FR)

(72) Inventors: Sébastien Colinet, Le Mesnil Saint-Denis (FR); Serif Karaaslan, Le Mesnil Saint-Denis (FR)

(73) Assignee: VALEO SYSTEMES THERMIQUES, Le Mesnil-Saint-Denis (FR)

( * ) Notice: Subject to any disclaimer, the term of this patent is extended or adjusted under 35 U.S.C. 154(b) by 821 days.

(21) Appl. No.: 17/278,893

(22) PCT Filed: Sep. 4, 2019

(86) PCT No.: PCT/FR2019/052040
§ 371 (c)(1),
(2) Date: Mar. 23, 2021

(87) PCT Pub. No.: WO2020/065160
PCT Pub. Date: Apr. 2, 2020

(65) Prior Publication Data
US 2022/0053661 A1    Feb. 17, 2022

(30) Foreign Application Priority Data

Sep. 24, 2018    (FR) ...................................... 1858620

(51) Int. Cl.
*H05K 7/14*    (2006.01)
*H05K 5/02*    (2006.01)
*B60H 1/22*    (2006.01)

(52) U.S. Cl.
CPC ......... *H05K 7/1432* (2013.01); *H05K 5/0247* (2013.01); *B60H 1/2215* (2013.01)

(58) Field of Classification Search
CPC .. H05K 7/1432; H05K 5/0247; H05K 5/0212; H05K 5/0214; B60H 1/2215
See application file for complete search history.

(56) References Cited

U.S. PATENT DOCUMENTS

| | | |
|---|---|---|
| 2011/0304248 A1 | 12/2011 | Dota |
| 2015/0334854 A1* | 11/2015 | Ushio .................. H05K 7/1427 361/752 |
| 2015/0340933 A1 | 11/2015 | Hattori et al. |

FOREIGN PATENT DOCUMENTS

| | | |
|---|---|---|
| CN | 104995405 A | 10/2015 |
| CN | 107027251 A | 8/2017 |

OTHER PUBLICATIONS

First Office Action in corresponding Chinese Application No. 201980057344.7, dated Oct. 9, 2021 (16 pages).
(Continued)

*Primary Examiner* — Emmanuel E Duke
(74) *Attorney, Agent, or Firm* — Osha Bergman Watanabe & Burton LLP

(57) ABSTRACT

The invention relates to an assembly of an electric power supply module and of a protective device for said module, said assembly being intended to equip an air-conditioning unit, in particular for a motor vehicle, said power supply module comprising a housing provided with regions allowing penetration of liquid into the housing, the protective device extending at least partially facing said regions so as to cause the liquid to flow beyond said regions, depending on the orientation of said power supply module.

15 Claims, 3 Drawing Sheets

(56) References Cited

OTHER PUBLICATIONS

Figure 1:
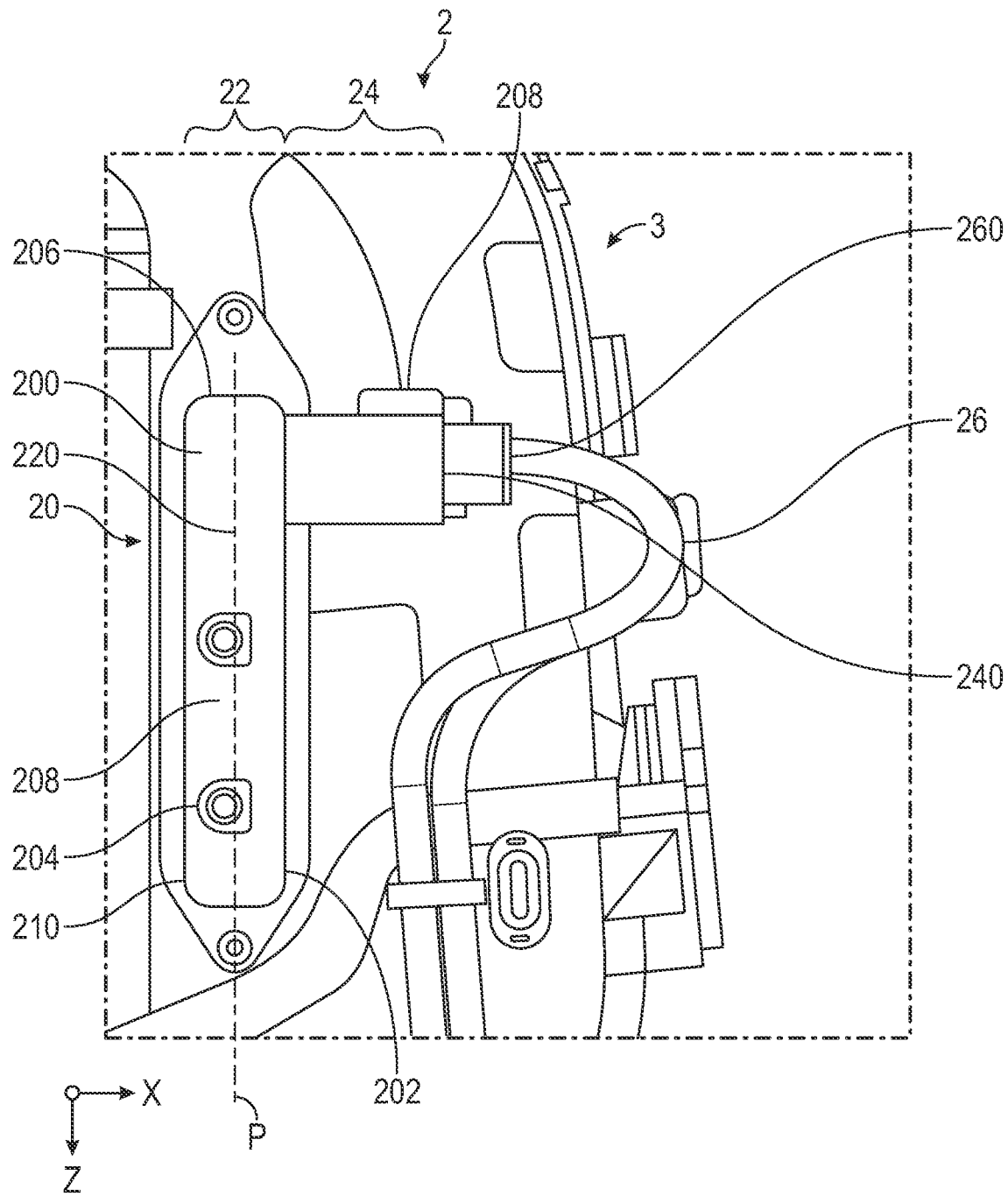

International Search Report with Written Opinion in corresponding International Application No. PCT/FR2019/052040, dated Dec. 12, 2019 (11 pages).

* cited by examiner

ASSEMBLY COMPRISING AN ELECTRICAL SUPPLY MODULE AND A PROTECTION DEVICE FOR SAID MODULE, AIR CONDITIONING UNIT EQUIPPED WITH SUCH AN ASSEMBLY

FIELD OF THE INVENTION

The invention relates to an assembly comprising an electric power supply module and a protective device for said module. The invention also relates to an air-conditioning unit comprising such an assembly, in particular for motor vehicles.

PRIOR ART

Motor vehicle air-conditioning housings conventionally have a location that serves to accommodate a heating body in which are installed a plurality of heating elements supplied with current from a power supply module. The power supply module is situated outside the air-conditioning unit. It generally comprises a printed circuit board. Conventionally, the printed circuit board has one or more connectors to external circuits. These connectors are located at the surface of the power supply module so that they can be easily connected to cables.

A large number of power supply modules thus have regions that are partially sealed, or even not sealed. For example, these may be regions for connecting the connectors to the cables or even regions for joining together parts forming a housing of said power supply modules.

However, the standard requirements for protection of electrical equipment of motor vehicles require that this equipment be effectively protected against the penetration of dust and water. In order to meet the fixed requirements, electrical equipment therefore has to be subjected to a test, during which it is inclined by +/−15° and exposed to a flow of liquid similar to heavy rain. In order to pass this test, no trace of water should be detected inside said electrical equipment. At the request of motor vehicle manufacturers, equipment fitters must produce power supply modules that meet these requirements.

The invention lies within this context, and proposes an assembly of an electric power supply module and of a protective device for said module, said assembly being intended to equip an air-conditioning unit, in particular for a motor vehicle, said power supply module comprising a housing provided with regions allowing penetration of liquid into the housing, the protective device extending at least partially facing said regions so as to cause the liquid to flow beyond said regions, depending on the orientation of said power supply module.

In this way, a protective device is provided that makes it possible to protect the power supply module from any liquid flow, be it by splashing or trickling of the liquid, not only vertically but also, within certain limits, irrespective of the angle of inclination.

According to other features of the invention, which may be considered together or separately:
- the protective device comprises a deflecting plate comprising a first concavity and/or a second concavity;
- the electric power supply module comprises a first region having a joining line between two parts of the housing;
- the electric power supply module comprises a second region for connection to external connectors;
- said deflecting plate extends facing said first and/or second regions;
- the deflecting plate comprises a top portion, and also a first inclined portion and/or a second inclined portion;
- the inclined portions and/or the top portion are flat;
- said portions are connected to the top portion by elbows;
- at least one of the inclined portions comprises a retaining member extending from said second inclined portion so as to promote the flow of the liquid in a given direction;
- the deflecting plate comprises a flank for mating with the air-conditioning unit;
- the deflecting plate comprises an inclined flank;
- said mating flank and inclined flank are situated on opposite sides of the top portion;
- the plate comprises reinforcing partitions extending from the top portion and/or said first and/or second inclined portions;
- the protective device comprises a means for fastening to the air-conditioning unit;
- the deflecting plate comprises an orifice for the passage of one or more electrical power supply cables of the power supply module;
- the power supply module comprises a printed circuit board, said board being coated with a layer made of a hydrophobic material.

The invention also relates to an air-conditioning unit for a motor vehicle, equipped with an assembly as described above.

Advantageously, said unit comprises an electric heating device provided with said power supply module.

PRESENTATION OF THE FIGURES

Figure 2:
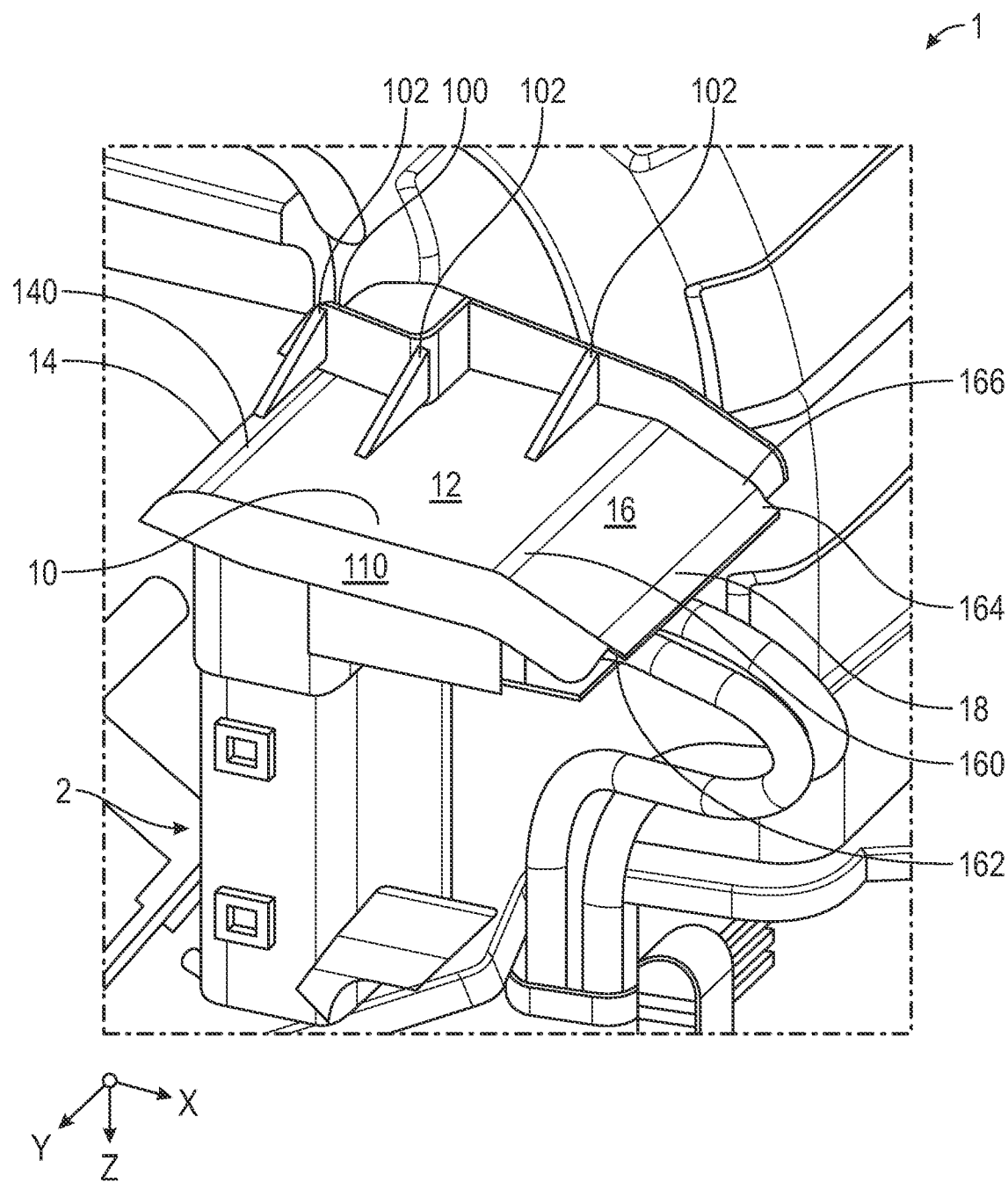
Figure 3:
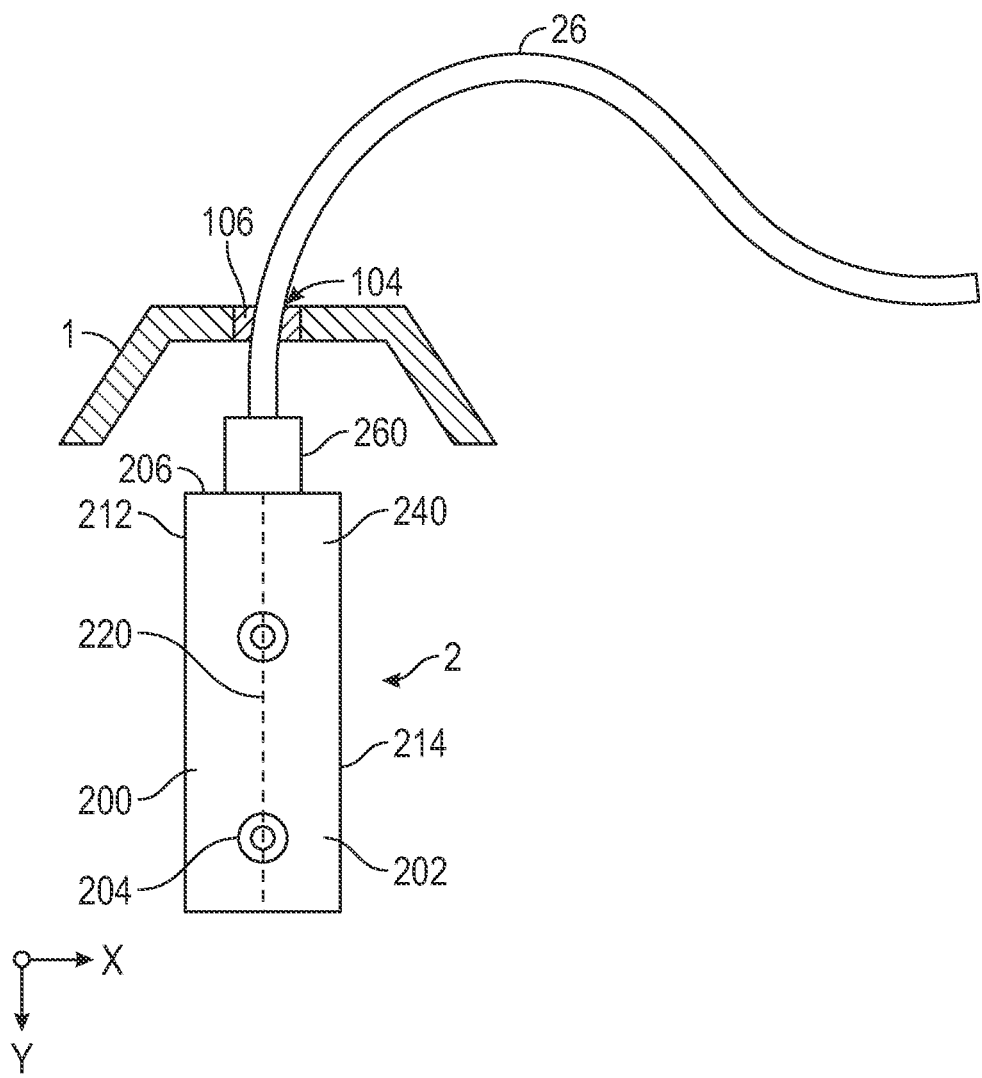

Other objects, features and advantages of the invention will become more clearly apparent from the following description, given with reference to the appended figures, in which:

FIG. 1 schematically illustrates, from the side, an electric power supply module according to the invention mounted on an air-conditioning unit, partially illustrated;

FIG. 2 schematically illustrates, in perspective, a protective device for the power supply module in FIG. 1, said device and said module forming an assembly according to the invention;

FIG. 3 schematically illustrates, from the side, a variant of an assembly of an electric power supply module and of a protective device for the power supply module, according to the invention.

DETAILED DESCRIPTION

The invention relates to an assembly of an electric power supply module 2 and of a protective device 1 for said module, said assembly being intended to equip an air-conditioning unit 3, in particular for a motor vehicle.

The air-conditioning unit 3 is intended to be situated beneath the dashboard of the vehicle. It allows the circulation of an air flow that is intended to be cooled and/or heated before being sent toward the interior of the vehicle. An enclosure is provided within said air-conditioning unit 3 so as to accommodate a heater. This heater has a heating body, which is not visible, and the power supply module 2.

The heating body has heating elements that are able to heat the air flow that is sent into the interior of the motor vehicle after having passed through the heating body, and are electrically connected to the power supply module 2 by means of electrodes. The heating body is in this case inserted into the air-conditioning unit 3 via one of its lateral walls, through an aperture provided therein.

The power supply module 2 serves to supply current to the heating elements via the electrodes. To ensure control of the current, it comprises a printed circuit board for supporting and electrically connecting together a set of electronic components.

As illustrated in FIG. 1, when the heater is positioned appropriately within the air-conditioning unit 3, the power supply module 2 remains outside of said air-conditioning unit 3.

The power supply module 2 comprises a housing 20 enclosing in this case the printed circuit board and the set of electronic components serving to supply power to and control the heating body. The housing 20 comprises regions 22, 24 that potentially allow unwanted penetration of liquid into said housing 20. In other words, said regions are partially not sealed, or even are not sealed.

A first region 22 of the housing 20 has a joining line 220 between two assembly parts 200 and 202 of said housing. Said joining line 220 extends around the entire periphery of the housing 20. More specifically, said joining line 220 extends over an upper face 206, a lateral face 208 and a lower face 210 of the housing 20, passing in this case through a median plane P of the power supply module.

For the purposes of closing the housing 20 and clamping the parts 200 and 202 together, closure means 204 can be provided at the joining line 220. In this regard, the closure means 204 consist, for example, of two members. A first member projects from at least one of said parts 200, 202, while a second member is connected to the other of said parts 200, 202 by a hinge, the second member having an orifice with a shape complementary to the shape of the first member.

Despite this, said closure means 204 do not make it possible to ensure the seal between the two parts along the joining line 220.

Furthermore, the housing 20 comprises a second region 24 for connection of the power supply module 2 to one or more connectors 260 to external circuits, provided with cables 26. The second connection region 24 comprises an interface 240 for connection to the connectors 260. Said connection interface 240 is situated, in particular, at a distal end of said second region 24 that is the opposite end from said first region 22. It is possible for the connection interface 240 not to be sealed.

Thus, the power supply module 2 therefore comprises, in the first region 22 and the second region 24, regions in which a liquid arriving on the housing 20 is likely to be able to penetrate and have access to the printed circuit board and/or to the electrical components located inside said module.

The assembly according to the invention can adopt different configurations.

In a first configuration, illustrated in FIG. 2, the second region 24 of the power supply module 2 extends substantially perpendicular to the first region 22, forming a protuberance coming from a large face of the housing. A slight angular offset of a few degrees is also possible. Still according to the first configuration, the protective device 1 is situated substantially above the upper face 206 of the housing 20, in use.

Another respective arrangement of the second region 24 with respect to the first region 22 can be provided, so as to make it easier to connect the electrical power supply cables 26 of the power supply module 2 to the connectors to external circuits.

In a second configuration, illustrated in FIG. 3, the second region 24 thus extends from the upper face 206, in the extension of the first region 22. Also in this configuration, the protective device 1 is situated substantially above the upper face 206, in use.

That being the case, irrespective of the configuration, the protective device 1 extends at least partially facing said regions 22, 24 so as to cause the liquid to flow beyond them, depending on the orientation of said power supply module, such that any penetration of liquid into the housing 20 is avoided and the printed circuit board and the electrical components are protected.

The protective device 1 comprises a deflecting plate 10, said plate comprising a first and/or a second concavity. The deflecting plate 10 extends at least partially facing said first and second regions 22, 24.

Preferentially, in order to form said first concavity, the deflecting plate 10 comprises a top portion 12, a first inclined portion 14 and a second inclined portion 16. The first and second inclined portions 14, 16 are situated on either side of the top portion 12 and are connected to said top portion 12 by means of elbows 140, 160.

Such an arrangement makes it possible, on the one hand, to cause the liquid to flow beyond said first and second regions 22, 24, and on the other hand, to prevent liquid from accumulating on the top portion 12, including when the air-conditioning unit 3 is subjected to an inclination, in particular of +/−15° in a first plane, parallel to said lateral face 208.

In the configuration of FIG. 2, the first inclined portion 14 is situated at least partially facing the first region 22 and extends beyond a lateral edge of said first region. The second inclined portion 16 is situated, for its part, at least partially facing the interface 240 for connection to the connectors, and extends beyond this interface 240 facing the cables 26.

Preferentially, the top portion 12 and the inclined portions 14, 16 can be flat. Alternatively, said top portion 12 and inclined portions 14 and 16 can be curved, or adopt any other configuration, as long as they allow the liquid flow to be driven beyond said first and second regions 22, 24.

Advantageously, if the protuberance forming the second region 24 is perpendicular to the first region 22, the second inclined portion 16 makes an angle of 15° with respect to the top portion 12. Thus, when the power supply module 2 is inclined by 15° during the heavy rain resistance tests, the angle of inclination of the second inclined portion 16 makes it possible to protect the direct flow of the liquid at said second region 24 of the module 2, even for the steepest inclination.

However, it is also advantageous to protect the housing 20, in particular the second region 24, and therefore the connection interface 240 from indirect trickling. Specifically, if liquid accumulates at a free end of the second inclined portion 16, said liquid will tend to trickle below said inclined portion 16 instead of being evacuated by detaching from said portion 16. This phenomenon will be all the more marked if the second inclined portion 16 is flat, as illustrated in FIG. 2.

Advantageously, the protective device 1 can then comprise a retaining member 18, in this case in the form of an L and/or extending perpendicularly from the second inclined portion 16.

The retaining member 18 is generally in the form of a channel situated at the edge of the second inclined portion 16. Said retaining member 18 advantageously makes it possible to prevent the indirect trickling of liquid below said second inclined portion 16 and, by contrast, guides it toward the side, far away from the connection interface 240, or even far away from the cables 26.

The second inclined portion 16 can also comprise a distal tab 162 extending beyond the retaining member 18. The tab 162 provides additional protection for the second region 24, protecting it from the indirect trickling of liquid subsequent to the power supply module 2 passing from a position that is inclined by +/−15° to a non-inclined position. It acts in particular as a drip guard.

Preferentially, said deflecting plate 10 comprises a flank 100 for mating with the air-conditioning unit 3. Said mating flank 100 extends in this case along the deflecting plate 10, perpendicularly to lateral edges of the top portion 12 and inclined portions 14, 16. Also preferentially, said mating flank 100 at least partially bears against the air-conditioning unit 3 and/or at least partially follows the contours of the air-conditioning unit 3.

Preferentially, the deflecting plate 10 also comprises an inclined flank 110 extending from the top portion 12 and inclined portions 14, 16. Here, said inclined flank 110 is situated along edges of the top portion 12 and inclined portions 14 and 16 that are the opposite edges from those from which the mating flank 100 extends. Like the inclined portions 14, 16, the inclined flank 110 makes it possible to cause the liquid to flow beyond the first and second regions 22, 24 of the housing 20 as a function of the angle of inclination of the power supply module 2, in a plane of inclination orthogonal to the first plane.

The plate 10 can also comprise reinforcing partitions 102 extending in this case perpendicular to the top portion 12 and/or to said first and second inclined portions 14, 16. Preferentially, the reinforcing partitions 102 extend from the mating flank 100 so as to obtain a squaring effect and to delimit cavities within the deflecting plate 10. The cavities thus created make it possible to guide the flow of the liquid over the deflecting plate 10. This also makes it possible to accumulate and confine a certain volume of liquid in one or more of the cavities, until said volume of liquid is driven beyond the power supply module 2 via the inclined portions 14, 16 and/or the inclined flank 110.

Furthermore, the protective device 1 can be provided with a means 101 for fastening to the air-conditioning unit 3. Preferably, said fastening means 101 can be situated on the flank 100 for mating with the air-conditioning unit 3. By way of example, the fastening means 101 can be a pin provided with an orifice for the passage of a fastening member such as a screw or the like.

With reference to FIG. 3, the assembly of the power supply module 2 and of the protective device 1 for said module is arranged according to the second configuration.

In this configuration, the protective device 1 is fastened, for example, at the electrical power supply cable(s) 26 of the power supply module 2. In this way, it is possible for the protective device 1 not to be fastened to the air-conditioning unit 3.

In the present case, the deflecting plate 10 comprises an orifice 104 for the passage of the electrical power supply cables 26 of the power supply module 2. The diameter of the orifice 104 is adjusted to the width of the cable(s) 26 such that there is little or no clearance when the cable(s) is/are in the orifice 104, i.e. the protective device 1 is fixedly connected to said cables 26.

To this end, a seal 106 can also be provided at the orifice 104. The seal 106 is annular and is arranged so as to conform in a sealed manner to the diameter(s) of the cable(s) 26 and to the plate 10. Preferably, the annular seal 106 is made of a plastics material. This advantageously makes it possible to prevent the liquid from trickling between the deflecting plate 10 and the orifice 104. This also makes it possible to make it easier to position the protection device 1 at the cables 26.

Preferentially, the orifice 104 can be situated at the top portion 12 such that said top portion 12 is situated at least partially facing the connection interface 240. Concomitantly, the inclined portions 14, 16 extend beyond the edges of large faces 212, 214 of the power supply module 2.

Such an arrangement makes it possible to cause the liquid to flow beyond said first and second regions 22, 24 of the power supply module 2, in particular when said power supply module 2 is inclined by +/−15° in different planes.

Said deflecting plate 10 is made, for example, in one piece, in particular by molding.

Very advantageously, in addition to the protection of the power supply module 2 by the device 1, said printed circuit board can be coated with a layer 300 made of a hydrophobic material. More specifically, the printed circuit board can comprise regions that are coated with the layer 300 made of a hydrophobic material and connection interfaces that are not coated with said layer 300.

The layer 300 made of a hydrophobic material makes it possible to prevent liquid from remaining in contact with the surface of the power supply module 2, and thus seals said module. Thus, even if a few drops of liquid managed to reach the supply module 2, it would not be possible for said drops to be able to penetrate into said module, in particular at said regions 22, 24.

The invention claimed is:

1. An assembly of an electric power supply module and of a protective device for said module, said assembly being configured to equip an air-conditioning unit, for a motor vehicle, said power supply module comprising a housing provided with regions allowing penetration of liquid into the housing, the protective device extending at least partially facing said regions so as to cause the liquid to flow beyond said regions, depending on the orientation of said power supply module.

2. The assembly as claimed in claim 1, wherein the protective device comprises a deflecting plate comprising a first concavity and/or a second concavity.

3. The assembly as claimed in claim 2, wherein the electric power supply module comprises a first region having a joining line between two parts of the housing, and/or a second region for connection to external connectors, said deflecting plate extending facing said first and/or second regions.

4. The assembly as claimed in claim 3, wherein the deflecting plate comprises a top portion, a first inclined portion and a second inclined portion.

5. The assembly as claimed in claim 4, wherein the inclined portions and/or the top portion are flat.

6. The assembly as claimed in claim 4, wherein said inclined portions are connected to the top portion by elbows.

7. The assembly as claimed in claim 4, wherein the second inclined portion comprises a retaining member extending from said second inclined portion so as to promote the flow of the liquid in a given direction.

8. The assembly as claimed in claim 4, wherein the deflecting plate comprises a flank for mating with the air-conditioning unit.

9. The assembly as claimed in claim 4, wherein the deflecting plate comprises an inclined flank, said mating flank and inclined flank being situated on opposite sides of the top portion.

10. The assembly as claimed in claim 4, wherein the plate comprises reinforcing partitions extending from the top portion and/or said first and/or second inclined portions.

11. The assembly as claimed in claim 2, wherein the protective device comprises a means for fastening to the air-conditioning unit.

12. The assembly as claimed in claim 2, wherein the deflecting plate comprises an orifice for the passage of one or more electrical power supply cables of the power supply module.

13. The assembly as claimed in claim 1, wherein the electric power supply module comprises a printed circuit board, said printed circuit board being coated with a layer made of a hydrophobic material.

14. An air-conditioning unit for a motor vehicle, equipped with an assembly of an electric power supply module and of a protective device for said power supply module, said power supply module comprising a housing provided with regions allowing penetration of liquid into the housing, the protective device extending at least partially facing said regions so as to cause the liquid to flow beyond said regions, depending on the orientation of said power supply module.

15. The unit as claimed in claim 14, further comprising an electric heating device provided with said electric power supply module.

\* \* \* \* \*